(12) United States Patent
Bae

(10) Patent No.: US 11,133,312 B2
(45) Date of Patent: Sep. 28, 2021

(54) SEMICONDUCTOR DEVICE, AND METHOD FOR MANUFACTURING THE SAME

(71) Applicants: SK hynix Inc., Icheon (KR); Hag-Youl Bae, Seoul (KR)

(72) Inventor: Hagyoul Bae, Seoul (KR)

(73) Assignees: SK hynix Inc., Icheon (KR); Hag-Youl Bae, Seoul (KR)

( * ) Notice: Subject to any disclaimer, the term of this patent is extended or adjusted under 35 U.S.C. 154(b) by 293 days.

(21) Appl. No.: 16/352,314

(22) Filed: Mar. 13, 2019

(65) Prior Publication Data

US 2019/0378841 A1 Dec. 12, 2019

(30) Foreign Application Priority Data

Jun. 8, 2018 (KR) ........................ 10-2018-0065827

(51) Int. Cl.
*H01L 27/102* (2006.01)
*H01L 21/8229* (2006.01)
*H01L 21/8252* (2006.01)
*H01L 23/528* (2006.01)

(52) U.S. Cl.
CPC ...... *H01L 27/1023* (2013.01); *H01L 21/8229* (2013.01); *H01L 21/8252* (2013.01); *H01L 23/528* (2013.01)

(58) Field of Classification Search
CPC ............... H01L 21/0257; H01L 21/324; H01L 21/8222; H01L 21/8229; H01L 27/075; H01L 27/0823; H01L 27/10; H01L 27/102; H01L 27/1022; H01L 27/1023; H01L 29/66666; H01L 29/7827; H01L 21/8252; H01L 23/528; H01L 23/5283; H01L 27/2463; H01L 27/285
See application file for complete search history.

(56) References Cited

U.S. PATENT DOCUMENTS

| | | | |
|---|---|---|---|
| 2012/0135580 A1* | 5/2012 | Scheuerlein | H01L 45/14 438/381 |
| 2014/0057402 A1* | 2/2014 | Guha | H01L 21/324 438/237 |
| 2016/0049404 A1* | 2/2016 | Mariani | H01L 27/1027 257/329 |

* cited by examiner

*Primary Examiner* — David C Spalla

(57) ABSTRACT

A semiconductor device and a method for manufacturing the semiconductor device are provided. The semiconductor device includes: a substrate: a drain region vertically disposed on the substrate; a body region vertically disposed on the drain region; a source region vertically disposed on the body region; a bit-line connected to the drain region and extending in a first direction; and a word-line connected to the source region and extending in a second direction that is different from the first direction. The drain region, the body region, and the source region together define a pillar extending in a third direction that is perpendicular to the first and second direction.

19 Claims, 18 Drawing Sheets

SEMICONDUCTOR DEVICE, AND METHOD FOR MANUFACTURING THE SAME

CROSS-REFERENCE TO RELATED APPLICATIONS

This application claims priority to Korean Patent Application No. 10-2018-0065827 filed on Jun. 8, 2018, in the Korean Intellectual Property Office, the disclosure of which is incorporated by reference herein in its entirety.

BACKGROUND

1. Technical Field

The present disclosure relates to a semiconductor device and a method for manufacturing the semiconductor device.

2. Description of the Related Art

In an information society, a semiconductor device becomes an essential element for processing and storing information. Many computers and digital devices include a large number of semiconductor devices.

A dynamic random access memory (DRAM) device, which is an example of a semiconductor device for storing information, stores data in a unit cell that is controlled by a word line and a bit line coupled to the unit cell. Each unit cell includes a transistor and a charge storage element that are connected in series to each other. A capacitance of the charge storage element is directly related to electrical characteristics and reliability of the unit cell of the DRAM device.

However, as a DRAM device is highly integrated, a design rule of the DRAM device is decreased, and thus a distance between adjacent charge storage elements on the same plane in the DRAM device is decreased. As a result, an effective area of a lower electrode forming a charge storage element is inevitably reduced. The reduction of the effective area of the lower electrode results in a decrease in a capacitance of the charge storage element. This may degrade the electrical characteristics and reliability of the DRAM device. Accordingly, attempts have been made to diversify a configuration of a charge storage element in the DRAM device.

SUMMARY

The present disclosure is designed to solve the above problem. The present disclosure aims at implementing a semiconductor device that operates without a gate.

The present disclosure aims at implementing a semiconductor device with no capacitor, thereby increasing a density of the semiconductor device.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In a first aspect of the present disclosure, there is provided a semiconductor device comprising: a substrate: a drain region disposed on the substrate; a body region disposed on the drain region; a source region disposed on the body region; a bit-line connected to the drain region and extending in a first direction; and a word-line connected to the source region and extending in a second direction that is different from the first direction, wherein the drain region, the body region, and the source region together define a pillar extending in a third direction that is perpendicular to the first and second directions.

In one embodiment of the first aspect, the bit-line electrically connects two or more drain regions arranged in the first direction, and the word-line electrically connects two or more source regions arranged in the second direction.

In a second aspect of the present disclosure, there is provided a semiconductor device comprising: a substrate: a drain region includes a first material; a body region includes a stack structure in which the first material and a second material are alternately stacked one or more times, the second material being different from the first material, wherein the second material is different from the first material; and a source region includes the first material.

In one embodiment of the second aspect, the device further includes a bit-line connected to the drain region and extending in a first direction; and a word-line connected to the source region and extending in a second direction different from the first direction.

In one embodiment of the second aspect, the first material is one of silicon (Si) and $Si_{1-x}Ge_x$; and the second material is the other one of Si and $Si_{1-x}Ge_x$, x being in a range of 0 to 1.

In one embodiment of the second aspect, the bit-line electrically connects two or more drain regions spaced in the first direction, and the word-line electrically connects two or more source regions spaced in the second direction.

In a third aspect of the present disclosure, there is provided a semiconductor device comprising: a drain region connected to a bit-line extending in a first direction; a source region connected to a word-line extending in a second direction different from the first direction; and a body region disposed between the drain region and the source region, wherein the body region stores therein holes or electrons based on a magnitude of a voltage applied to the bit-line and word-line.

In one embodiment of the third aspect, the drain region is made of a first material, wherein the body region includes a vertical alternately-repeating stack of the first material and a second material, wherein the second material is different from the first material, wherein the source region is made of the first material.

In one embodiment of the third aspect, the first material is silicon (Si), while the second material is $Si_{1-x}Ge_x$; alternatively, the first material is $Si_{1-x}Ge_x$ while the second material is Si.

In a fourth aspect of the present disclosure, there is provided a method for manufacturing a semiconductor device, the method comprising: providing a substrate having first, second, third regions divided; doping a first impurity into the first region; doping a second impurity into the second region disposed on the first region; doping the first impurity into the third region disposed on the second region; multiple-etching the substrate into which the first and second impurities are doped to form a plurality of unit cells, wherein each unit cells has the first region as a drain region, the second region as a body region, and the third region as a source region; forming a bit-line that extends in a first direction and is connected to the drain region; and forming a word-line that extends in a second direction different from the first direction and is connected to the source region, wherein the drain region, the body region, and the source region together define a pillar extending in the third direction that is perpendicular to the first and second directions.

In a fifth aspect of the present disclosure, there is provided a method for manufacturing a semiconductor device, the method comprising: providing a substrate made of a first material: epitaxially-growing a second material on the substrate to form a first epitaxially-grown portion to reach a first height from a top face of the substrate; epitaxially-growing a vertical alternately N-repeated stack of first and second materials on the first height to form a second epitaxially-grown portion to reach a second height from the first height; epitaxially-growing a first material on the second height to form a third epitaxially-grown portion to reach a third height from the second height; partially-etching the first, second, third epitaxially-grown portions, and partially-etching the substrate, to obtain a semiconductor device, wherein the semiconductor device includes: a drain region defining a bottom portion of a non-removed portion of the first epitaxially-grown portion; a body region defining a non-bottom portion of the non-removed portion of the first epitaxially-grown portion and a non-removed portion of the second epitaxially-grown portion; and a drain region defining a non-removed portion of the third epitaxially-grown portion.

In one embodiment of the fifth aspect, the method further comprises: after obtaining the semiconductor device, extending a bit-line in a first direction to be connected to the drain region; and depositing an insulating material into between adjacent semiconductor devices; and extending a word-line in a second direction different from the first direction to be connected to the source region.

In one embodiment of the fifth aspect, extending the bit-line includes extending the bit-line to electrically connect drain regions of two or more semiconductor devices, wherein extending the word-line include extending the word-line to electrically connect source regions of two or more semiconductor devices.

In one embodiment of the fifth aspect, the first material is silicon (Si), while the second material is $Si_{1-x}Ge_x$; alternatively, the first material is $Si_{1-x}Ge_x$ while the second material is Si.

In one embodiment of the fifth aspect, a material pair of the first material and the second material or a material pair of the second material and the first material includes one selected from a group consisting of GaN/InGaN, $InAs/In_{1-x}Ga_xAs$, and $Al_xGa_{1-x}/GaAs$.

According to one embodiment of the present disclosure, the gateless (thus, free of the gate insulating film) and capacitorless structure may be implemented, which may drastically reduce the number of the processes compared to the conventional case. Further, since there is no gate insulating film, device reliability-related problem due to deterioration of insulating film may be essentially eliminated.

According to one embodiment of the present disclosure, the semiconductor device is fabricated as the doping process or the epitaxial process. This has the effect of reducing the total number of production processes of the device.

According to one embodiment of the present disclosure, the asymmetric doping profile, as electrical characteristic in the vertical direction of the body region or base region may block the sneaky path in the cell adjacent to the corresponding cell when the cells are arranged in an array.

According to one embodiment of the present disclosure, the semiconductor device having the capacitorless structure has a vertical orientation. This may reduce the dimension of the device to allow a highly integrated semiconductor device.

According to one embodiment of the present disclosure, the charges may be stored in the base or the body region without a capacitor. Thus, the manufacturing process of the device may be simple and highly integrated. The device has the low power consumption to find an application as a neuromorphic device.

Effects of the present disclosure may not be limited to the effects as described above. Further specific effects of the present disclosure as well as the effects as described above will be described in conduction with illustrations of specific details for carrying out the present disclosure

DETAILED DESCRIPTION

Figure 1:
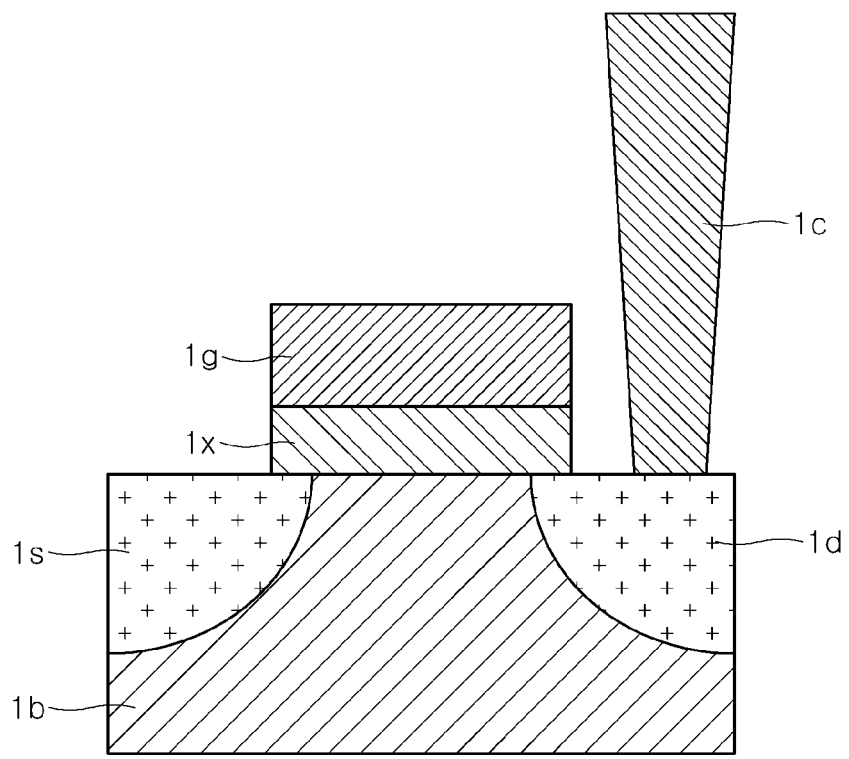
FIG. 1 shows a semiconductor device with 1T/1C.

Various embodiments of the present disclosure are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Like reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer, or section described below could be termed a second element, component, region, layer, or section, without departing from the spirit and scope of the present disclosure.

It will be understood that when an element or layer is referred to as being "connected to" or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for describing particular embodiments only and is not intended to be limiting of the present disclosure. As used herein, the singular forms "a" and "an" are intended to include the plural forms as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a DRAM device will be exemplarily described as one embodiment of a semiconductor device.

FIG. 1 shows a DRAM device that includes a unit cell including one transistor and one capacitor. Both lateral portions of a body 1b define a source is and a drain 1d, respectively. A gate insulating film 1x and a gate 1g are vertically disposed on the body 1b between the source 1s and the drain 1d, and a capacitor 1c is disposed on the drain 1d.

In FIG. 1, areas for the source 1s, the drain 1d, the gate 1g, and the capacitor 1c are required per unit cell. These areas increase a size of an overall horizontal area of the DRAM device.

Figure 2:
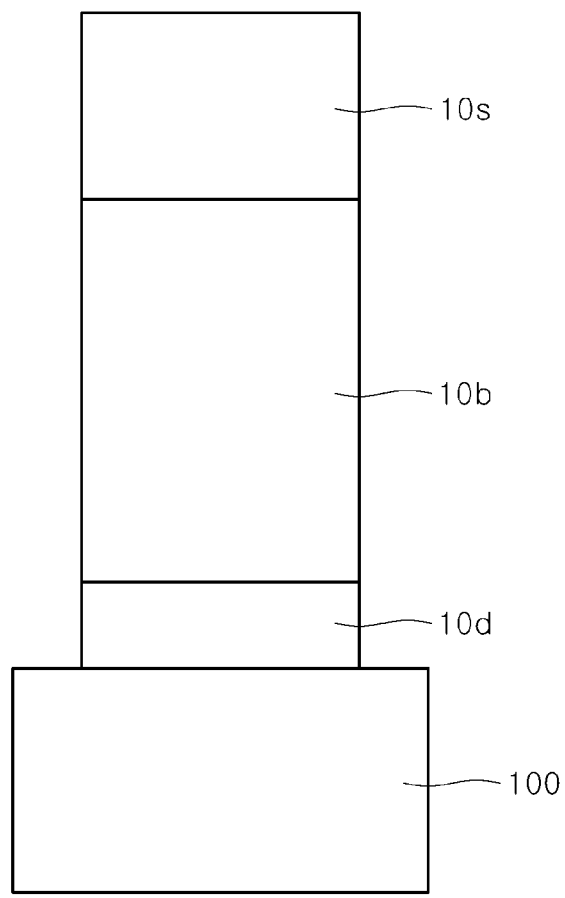
FIG. 2 shows a semiconductor device according to an embodiment of the present disclosure.

FIG. 2 shows a semiconductor device according to an embodiment of the present disclosure. In FIG. 2, to configure a gateless capacitorless cell, one element may play both gate role and capacitor role.

In FIG. 2, a drain region 10d, a body region 10b, and a source region 10s may be grown or deposited on a substrate 100. The drain region 10d may be referred to as an emitter. The body region 10b may be referred to as a base. The source region 10s may be referred to as a collector. The body region 10b and the source region 10s are vertically stacked on the drain region 10d that is disposed on the substrate 100.

In an embodiment, the substrate 100 and the drain region 10d may be formed integrally. In another embodiment, the body region 10b and the source region 10s may also be integrally formed on the drain region 10d. The vertically stacked structure defines a vertical columnar shape or a pillar shape.

Compared with the configuration shown in FIG. 1, the configuration shown in FIG. 2 has a vertical structure with no gate and no capacitor. In an embodiment, the body region 10b may include a stack structure of silicon (Si) and germanium (Ge) layers that are alternately stacked one or more times in a vertical direction that is perpendicular to a top surface of the substrate 100. In another embodiment, the body region 10b may include a stack structure of $Si_{1-x}Ge_x$ layers that are stacked more than one time in the vertical direction. In still another embodiment, the body region 10b may include a stack structure of a Si layer and a $Si_{1-x}Ge_x$ layer that are alternately stacked one or more times in the vertical direction.

In FIG. 2, the body region 10b may have a multi-layered $Si/Si_{1-x}Ge_x$ structure. A bandgap of the body region 10b may be controlled to improve memory characteristics, to reduce an operating voltage, and improve a sensing margin. The vertical stack configuration of the unit cell shown in FIG. 2 may increase the degree of integration of the semiconductor device. Further, since there is no gate, a gate insulating film is not employed. Thus, a reliability problem of the semiconductor device due to deterioration of the gate insulating film may be essentially eliminated.

In the configuration of FIG. 2, multiple cells, e.g., DRAM cells, may be stacked vertically on the substrate 100. Each of the DRAM cells includes the drain region 10d, the body region 10b, and the source region 10s. The drain region 10d may be formed integrally with the substrate 100, as shown in subsequent figures. The body region 10b is disposed on the drain region 10d. The source region 10s is disposed on the body region 10b.

In an embodiment, the drain region 10d and the source region 10s are first impurity implanted regions, and the body region 10d is a second impurity implanted region. In an embodiment, the impurity is a dopant. The first impurity implanted region is a region into which a first impurity is doped, and the second impurity implanted region is a region into which a second impurity is doped. The first impurity has a first conductivity type that is opposite to a second conductivity type of the second impurity.

In an embodiment, the body region 10b is an n+ doped region, and the drain region 10d and the source region 10s are p+ doped regions. As a distance from the drain region 10d or the source region 10s to the body region 10b increases, that is, as it goes closer to the center of the body region 10b, the n+ doping concentration may increase. However, embodiments of the present disclosure are not limited thereto. In another embodiment, the drain region 10d and the source region 10s may be n+ doped regions, while the body region 10b may be a p+ doped region.

In FIG. 2, the n+ doped region, that is, the body region 10b, defines an n-type semiconductor, while the p+ doped region, i.e., each of the drain region 10d and the source region 10s, defines a p-type semiconductor. In another embodiment, the body region 10b defines a p-type semiconductor by p+ doping, while each of the drain region 10d and source region 10s defines an n-type semiconductor by n+ doping.

Further, in another embodiment, the drain region 10d and the source region 10s each include $Si_{1-x}Ge_x$. The body region 10b may include the stack structure of silicon (Si) and germanium (Ge) layers that are alternately stacked one or more times in the vertical direction, or alternatively may include the stack structure of the $Si_{1-x}Ge_x$ layers that are stacked more than one time in the vertical direction. This will be illustrated in FIGS. 7A, 7B, and 8.

FIGS. 3A to 3I illustrate a method of fabricating a vertical semiconductor device, e.g., a DRAM cell having a vertical structure, according to an embodiment of the present disclosure.

Figure 3A:
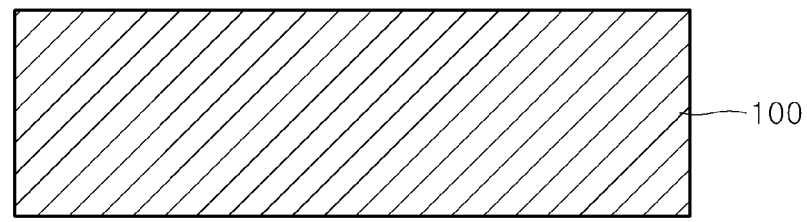
FIGS. 3A to 3I illustrate a method of fabricating a semiconductor device according to an embodiment of the present disclosure.

Referring to FIG. 3A, a substrate 100 containing, e.g., p-type germanium, is provided. In an embodiment, the substrate 100 may include any of various materials, such as silicon, germanium, or the like.

Figure 3B:
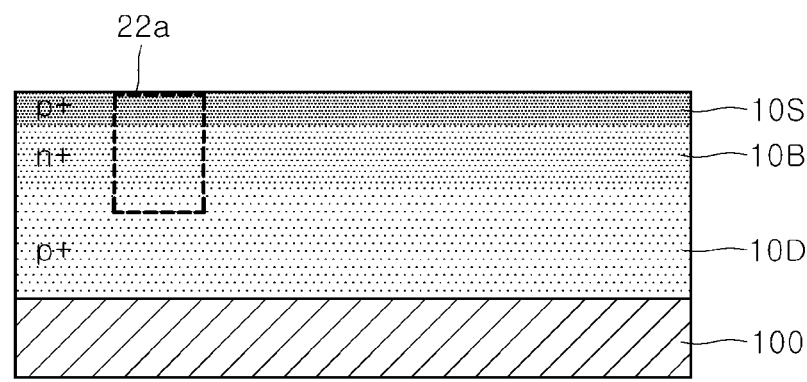

Referring to FIG. 3B, ion implantation is performed into the substrate 100. The substrate 100 after the ion implantation includes a p+ doped region 10D, a n+ doped region 10B, and a p+ doped region 10S. When the p-type germanium is used as the substrate material, a single doping process (n+ doping) may be performed to form the doped regions 10D, 10B, and 10S, which reduces the number of doping processes.

In another embodiment, p+ doping and n+ doping may be performed, respectively, into an n-type substrate. In an example, boron is first doped into the substrate, then, phosphorus is doped into the substrate, and, then, boron is doped into the substrate. Thus, the p+, n+, p+ doped regions may be formed. The p+, n+, p+ doped regions, which are distinguished from each other by the doping types, correspond to the drain, body, and source regions as described above with reference to FIG. 2.

After performing the doping process and before depositing a photoresist (PR) for patterning the doped regions 10D, 10B, and 10S, a hard mask film serving as a protective layer may be optionally formed.

Figure 3C:
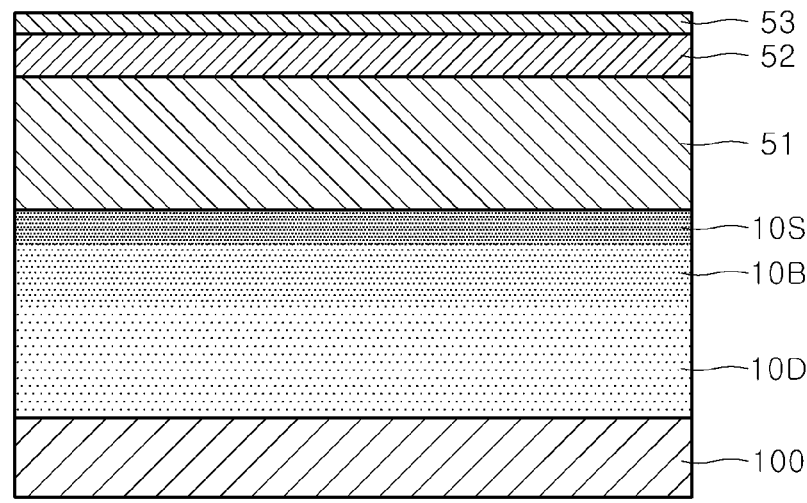

Referring to FIG. 3C, a stack structure of an amorphous carbon layer (ACL) 51 and a SiN layer 52 may be formed as a protective layer over the substrate 100 including the doped regions 10D, 10B, and 10S. In an embodiment, the ACL layer 51 may be deposited to have about 200 nm thickness, and the SiN layer 52 may be deposited to have about 20 nm thickness.

After depositing the protective layers 51 and 52, a photoresist 53 is deposited on the protective layers 51 and 52. After that, the deposited photoresist 53 is exposed with light and patterned through a lithography process using a mask or E-beam lithography, so that a patterned photoresist 53' is formed.

Figure 3D:
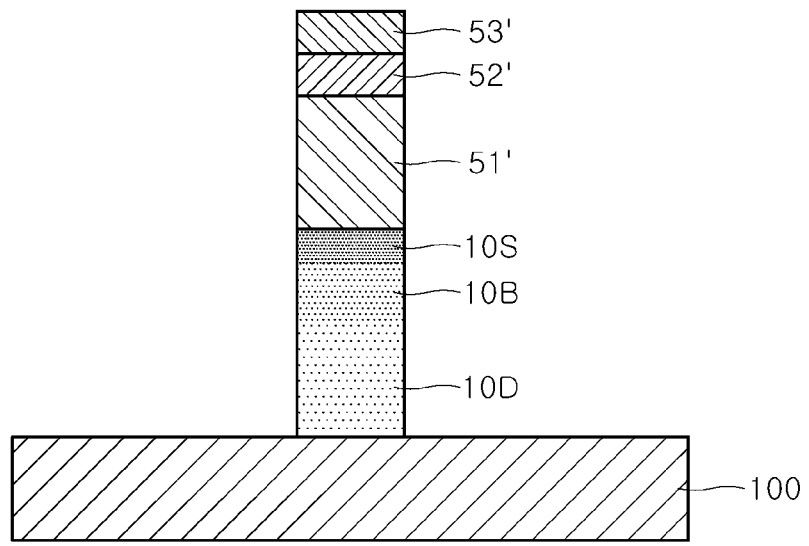

Referring to FIG. 3D, a dry etching is performed using the patterned photoresist 53' as an etch mask. In another embodiment, a wet etching may be performed. Any of various etching schemes such as a physical etching and a chemical etching may be performed. The present disclosure is not limited to a specific etching scheme. In an embodiment, the semiconductor device may be formed by performing a one-time dry etching process.

Briefly, the protective layers 51 and 52 are formed on the substrate 100, and, then, the photoresist 53 is patterned. Thereafter, the etching process is performed using the patterned PR 53' as a mask to partition a plurality of vertical DRAM cell regions within the substrate 100 including the doped regions 10D, 10B, and 10S. In the patterning and etching processes, a variety of materials and schemes may be used. In an example, the dry etching or wet etching may be performed.

Referring to FIG. 3D, the protective layers 51 and 52 and the doped regions 10D, 10B, and 10S are patterned by performing the etching process using the patterned PR 53' as the mask, so that the plurality of vertical DRAM cell regions are formed. Each of the plurality of vertical DRAM cell regions includes patterned protective layers 51' and 52', a drain region 10d, a body region 10b, and a source region 10s. In an embodiment, each of the plurality of vertical DRAM cell regions has a vertical column shape (or a pillar shape), and the plurality of vertical DRAM cell regions are separate from each other.

Figure 3E:
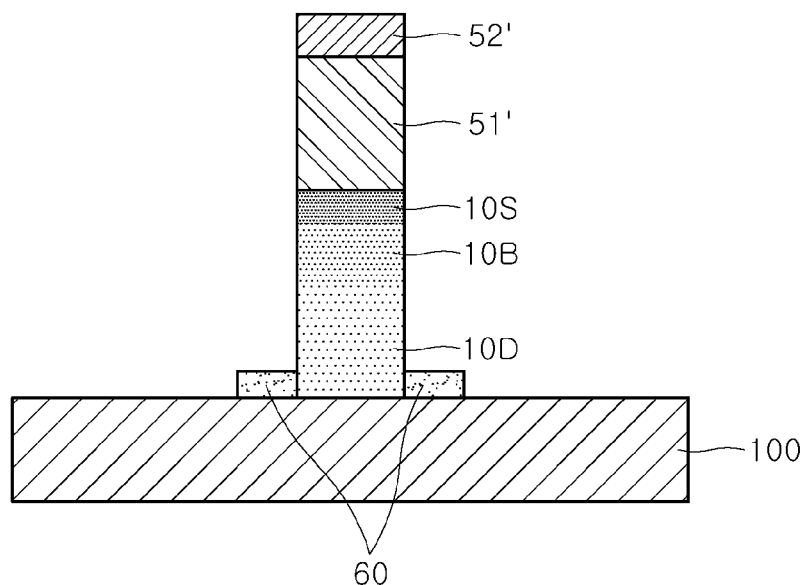

Referring to FIG. 3E, the patterned photoresist 53' is removed, and a bit line 60 is formed, using a specific metal, to surround a lower portion of the drain region 10d on the substrate 100.

A single etching and masking process may be performed to form the bit line 60 at a lower end of a DRAM cell. The bit line 60 is electrically connected to a drain region of each DRAM cell and extends in a first direction. For example, a metal layer may be formed at the lower end of the DRAM cell, and the metal layer may be patterned to form the bit line 60. As a result, drain regions 10d of a multiplicity of DRAM cells arranged in the first direction may be electrically connected to each other via the bit line 60.

A word line 70 electrically connects source regions 10s of two or more DRAM cells arranged in a second direction. In an embodiment, the first direction and the second direction may be orthogonal to each other. In other embodiments, the first direction and the second direction may cross each other to have any of various angles, such as 60 degrees, 30 degrees, etc., based on the orientation of the DRAM cell. In other words, a vector corresponding to the first direction and a vector corresponding to the second direction may define different angles.

Figure 3F:
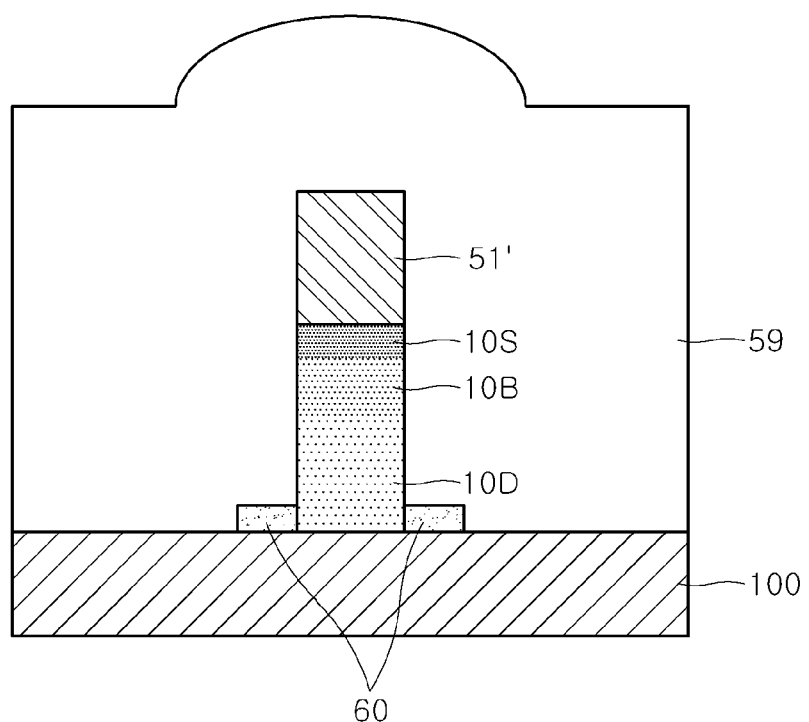

Referring to FIG. 3F, the patterned protective layer 52' is removed, and then a material layer 59, for example, a $SiO_2$ layer, is deposited to insulate DRAM cells from each other. The material layer 59 may fill spaces between the DRAM cells and cover tops of the DRAM cells. The deposition of the material layer 59 may be carried out using plasma-enhanced tetraethyl-orthosilicate (PE-TEOS).

Figure 3G:
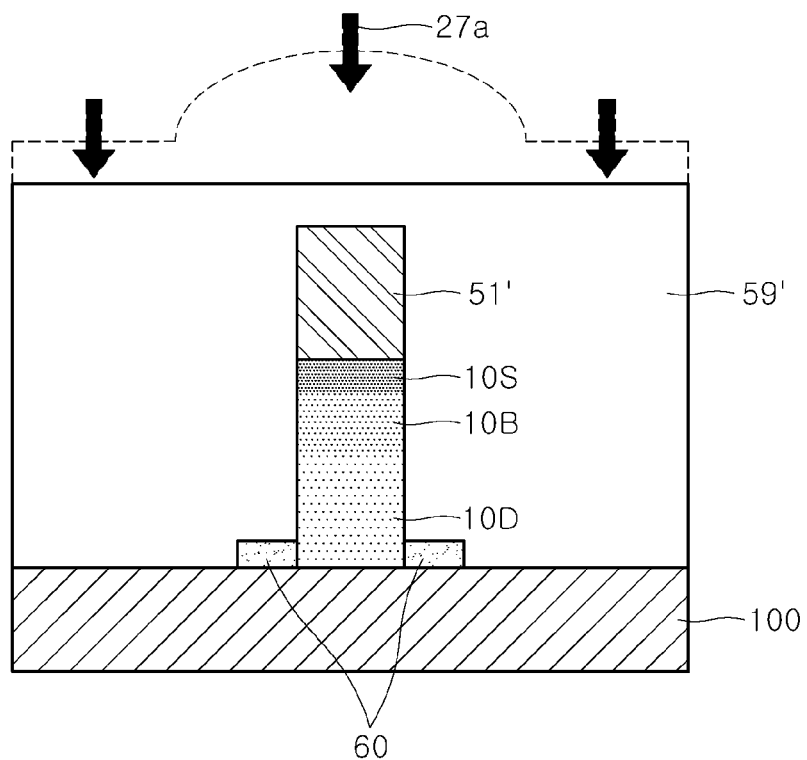

Then, the deposited material layer 59 may be planarized using a chemical mechanical polishing (CMP) 27a as shown in FIG. 3G, so that a planarized material layer 59' is formed. In FIG. 3G, a dotted-line represents a region that was removed by the planarization process.

Figure 3H:
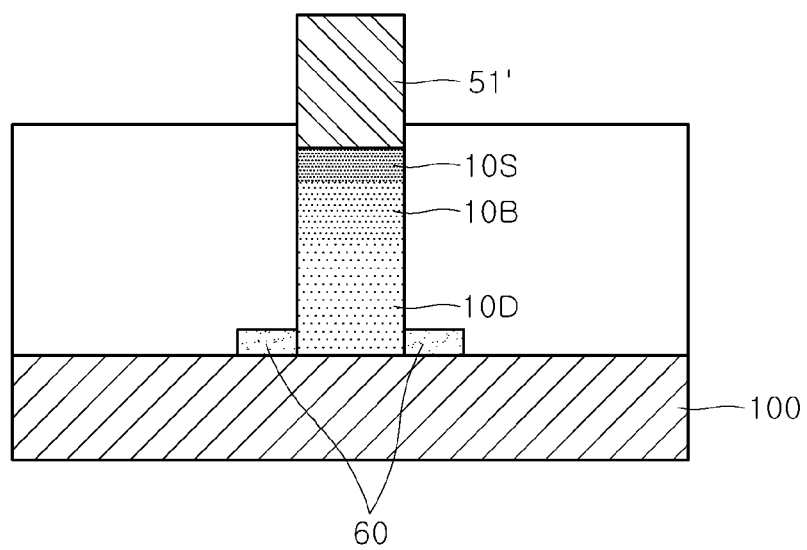

Referring to FIG. 3H, after the planarization process, a dry etch or wet etch process is performed on the planarized material layer 59' to expose a portion of the patterned ALC layer 51'. In an embodiment, a blanket etch-back process may be performed without using a mask. This etching process may be performed using a buffered oxide etchant (BOE).

Figure 3I:
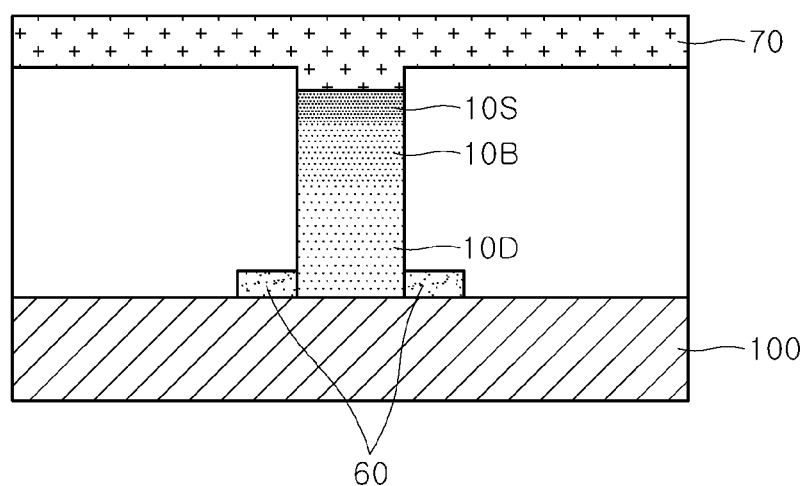

Referring to FIG. 3I, the partially exposed ACL layer 51' is removed using an $O_2$ plasma, and, then, the word line 70 is formed using a metal. The word line 70 extends in the second direction to electrically connect source regions 10s of a multiplicity of DRAM cells arranged in the second direction. The word line 70 is deposited to fill a portion from which the patterned ACL layer 51' is removed, and thus the word line 70 is in contact with the source regions 20s of the multiplicity of DRAM cells arranged in the second direction. A mask may be used in this deposition process of the word line 70.

In the processes described with reference to FIGS. 3A to 3I, the DRAM cell may be configured without a gate and a gate insulating film. The DRAM cell may be oriented in a vertical direction that is perpendicular to the first and second directions.

Further, a capacitorless structure may be implemented. This approach may allow a DRAM cell and a periphery transistor to be configured such that there is no difference in height therebetween. This approach may allow a back-end process to be very easy. Moreover, this approach may implement a vertically-stacked highly integrated device.

That is, according to embodiments of the present disclosure, the p+-n+-p+ doping or the n+-p+-n+ doping is performed into a bulk wafer including Si, Ge, or SiGe and then a vertical structure is formed using a dry etching. Thus, a unit cell is formed in the vertical direction. Further, a PR trimming may realize a DRAM cell size of 30 nm or smaller.

In addition, in a DRAM cell having a vertical structure, e.g., a pillar shape, which is free of a separate gate, a word line and a bit line may be disposed at both ends of the DRAM cell, respectively, in the vertical direction. As a result, the size of the DRAM cell may be reduced. Furthermore, since a DRAM cell is free of a gate and a capacitor, the number of processes of fabricating the DRAM cell is also reduced compared to a conventional DRAM cell having a gate and a capacitor.

Figure 4:
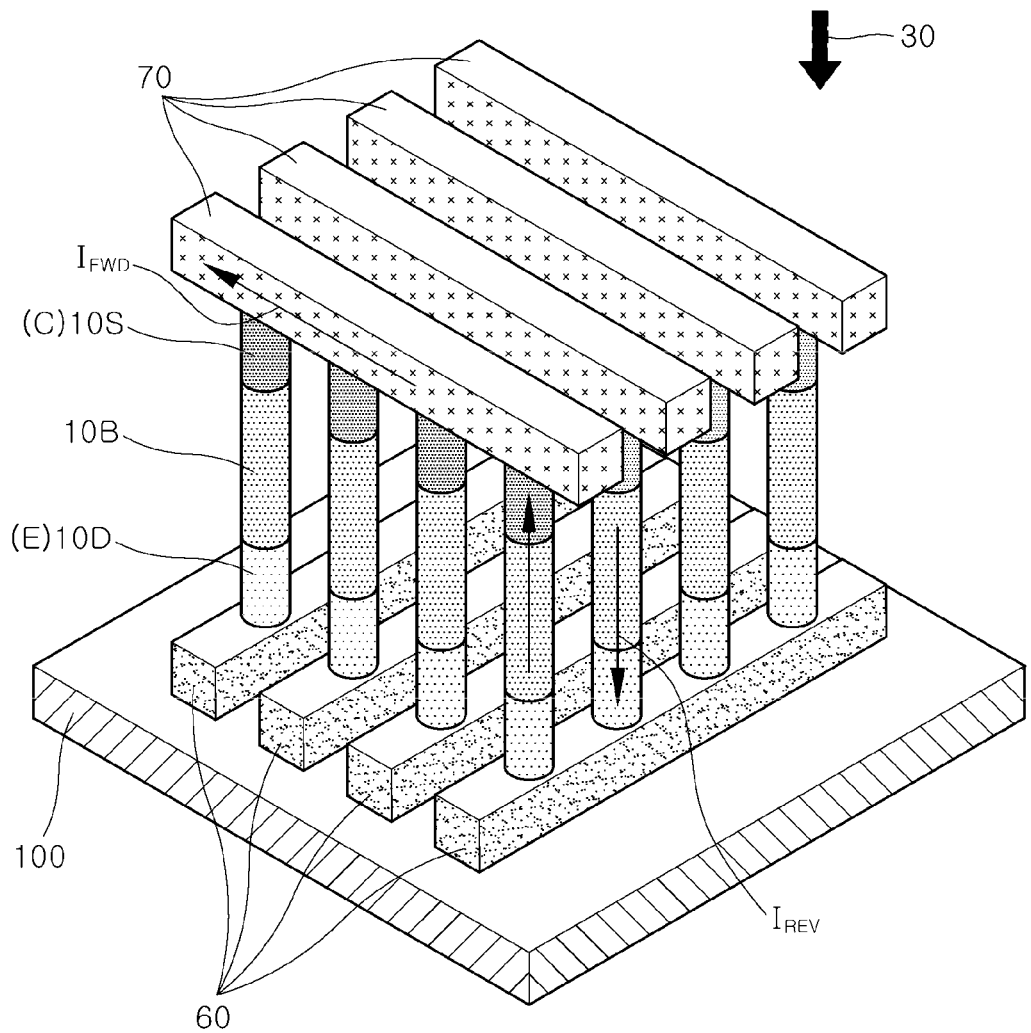
FIGS. 4 and 5 show a cell array of a semiconductor device according to an embodiment of the present disclosure.
Figure 5:
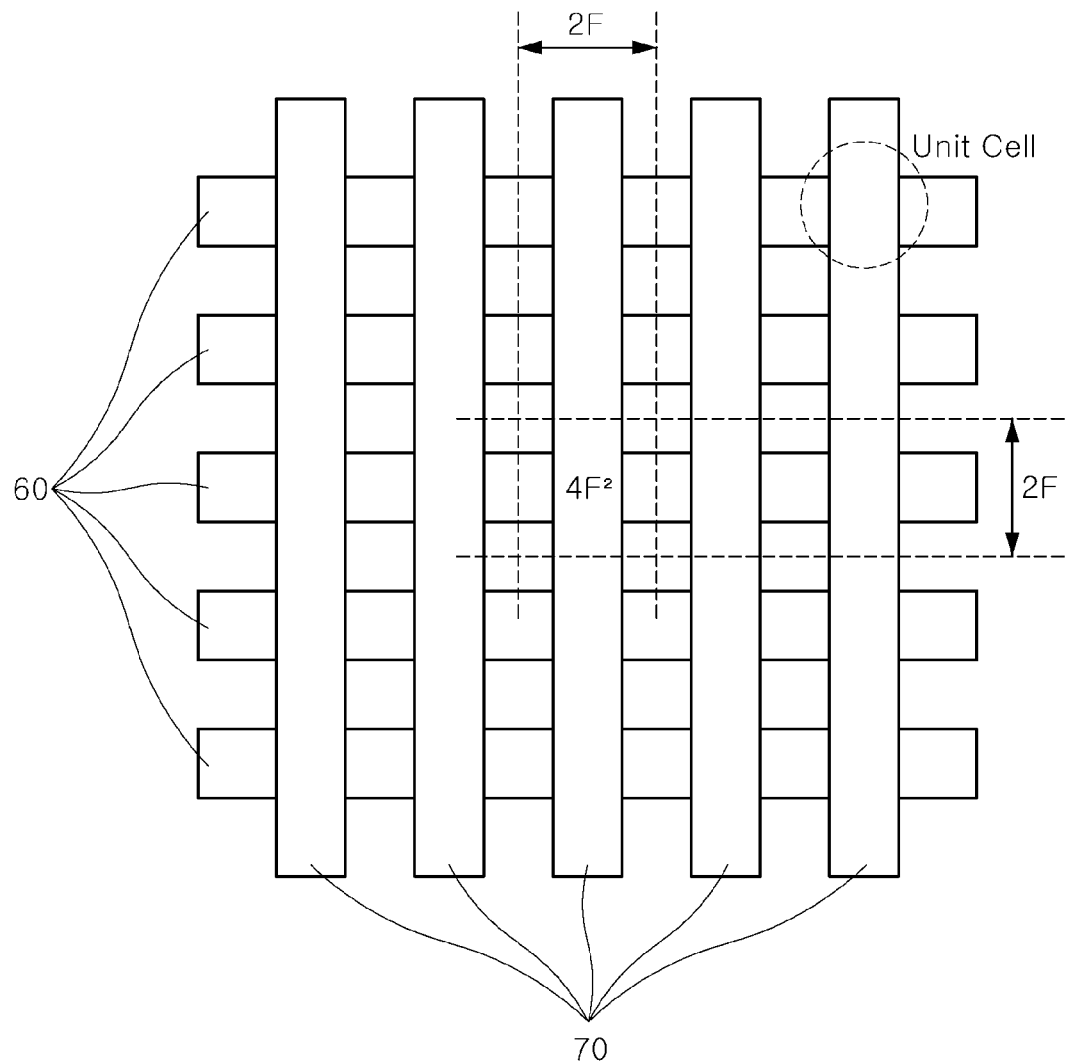

FIGS. 4 and 5 show an array of a semiconductor device fabricated according to FIGS. 3A to 3I, according to an embodiment of the present disclosure. In FIG. 4, each of a plurality of DRAM cells has a vertical columnar shape on the substrate 100. Each of the DRAM cells includes the source 10s, the body 10b, and the drain 10d. In each of the DRAM cells, a corresponding word line 70 extends in the second direction. In addition, in each of the DRAM cells, a corresponding bit line 60 extends in the first direction that is perpendicular to the second direction. As a result, charges are accumulated in the body 10b according to electrical signals that are applied to the word line 70 and the bit line 60, thereby implementing a function of the DRAM cell.

In an embodiment of the present disclosure, the substrate 100 may include a Si or Ge layer, and, on the Si or Ge layer, a $Si_{1-x}Ge_x$ layer may be repeatedly deposited. As such, the $Si_{1-x}Ge_x$ layer may provide a function of storing charges.

FIG. 4 shows a perspective view of an array structure using two terminals C and E. In such a structure, a sneaky path may be blocked. For example, in FIG. 4, when a forward current $I_{FWD}$ is flowing from the drain 10d, as one terminal E, through the body 10b to the source 10s, as the other terminal C, in a certain cell, a reverse current $I_{REV}$ may not flow in a cell adjacent to the certain cell. This is because the two terminals C and E have a unidirectional flow.

FIG. 5 shows a top view of the array structure from a direction 30 in FIG. 4 when the bit line 60 and the word line 70 intersect each other. A unit cell is disposed at an intersection region of the bit line 60 and the word line 70. The unit cell defines one vertical DRAM cell. In the unit cell, a length of each of the word line 70 and the bit line 60 is 2F. As such, a single DRAM cell or a unit cell may have a gateless capacitorless vertical two-terminal structure that has a horizontal cross-sectional area of $4F^2$.

The vertical two-terminal structure may increase the degree of integration of the semiconductor device. Further, this may allow a cell pitch, that is, a spacing between two adjacent cells, to be 30 nm or smaller. Conventionally, a horizontal size of a DRAM cell was $6F^2$. However, in the embodiment of the present disclosure, the horizontal size of the DRAM cell is reduced to $4F^2$, which allows for the high degree of integration. Furthermore, a low bandgap energy between Si and Ge may result in a low operating voltage and a high drive current.

Referring to the embodiment described with reference to FIGS. 3A to 5, the p+-n+-p+ doping or the n+-p+-n+ doping is performed into the bulk wafer including Si, Ge, or SiGe, and, then, the dry etching is performed to form a unit cell having a vertical two-terminal structure. The vertical two-terminal structure has one word line and one bit line, and thus improves the degree of integration. This is because each DRAM cell is composed of a collector C, a base B, and an emitter E as a bipolar junction transistor (BJT) structure having an open base.

The vertical semiconductor device or vertical DRAM cell includes a stack structure of the drain region, the body region, and the source region, and has a vertical columnar shape (or a pillar shape). The gateless-capacitorless configuration achieves a low voltage and low power operation, realizes a highly-integrated embedded DRAM (eDRAM), and improves high bandwidth memory (HBM) performance.

Referring back to FIG. 2, the body region 10b is n+ doped. When the distance from the drain region 10d or the source region 10s to the body region 10b increases, i.e., it goes closer to the center of the body region 10b, the n+ doping concentration in the body region 10b increases. Conversely, when the distance from the drain region 10d or the source region 10s to the body region 10b decreases, i.e., it goes farther from the center of the body region 10b, the n+ doping concentration in the body region 10b decreases.

Similarly, each of the drain region 10d and the source region 10s is p+ doped. When the distance of each of the drain region 10d and the source region 10s from the body region 10b increases, the p+ doping concentration in each of the drain region 10d and the source region 10s increases. The change in the n+ and p+ doping concentrations according to locations may also be confirmed at curves 22n/22p in FIG. 6 below.

Figure 6:
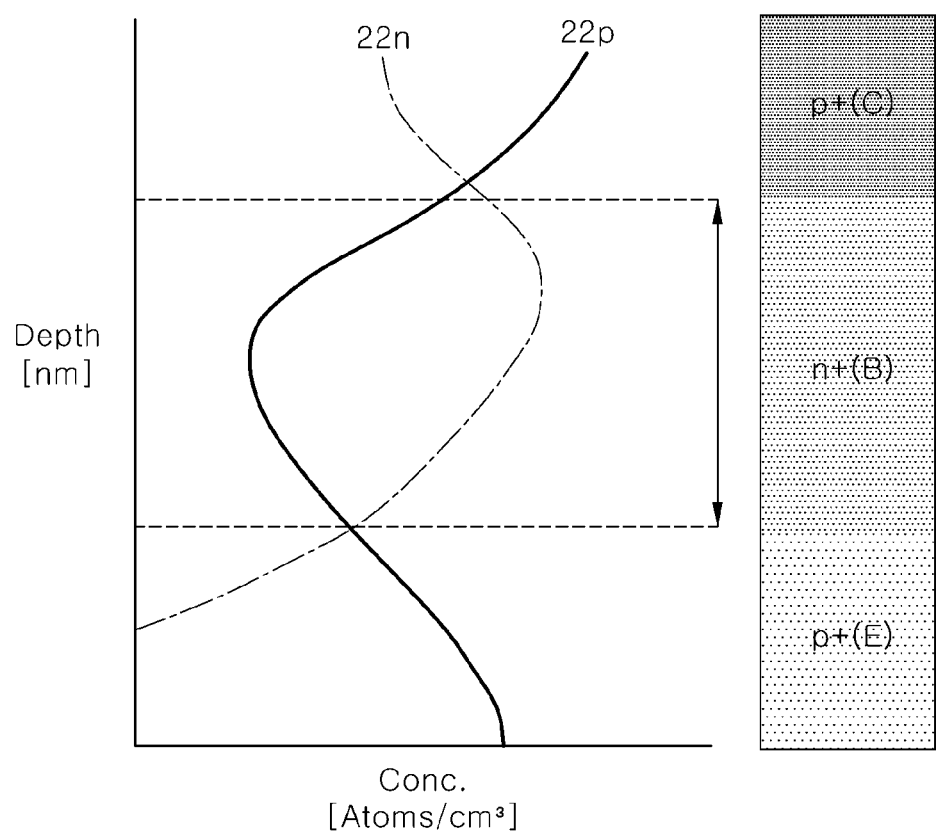
FIG. 6 shows electrical characteristics of the semiconductor device shown in FIG. 3B according to an embodiment of the present disclosure.

FIG. 6 shows electrical characteristics of a portion 22a shown in FIG. 3B according to an embodiment of the present disclosure.

The portion 22a shown in FIG. 3B includes C/B/E regions (collector C, base B, and emitter E). In FIG. 6, a curve 22n represents a distribution of n+ particles after the n+ doping, and a curve 22p indicates a distribution of p+ particles after the p+ doping. A thickness of the base region B may be determined by adjusting a projected range (PR) of ion implantation into each of the C, B, and E regions. Setting points related to the ion implantation are shown in Table 1:

TABLE 1

| Region | Ion | Thickness ($R_p$ [nm]) | Concentration [/cm²] |
|---|---|---|---|
| E | Boron | 240 | 1 × 15 |
| B | Phosphorus | 100 | 5 × 15 |
| C | Boron | 10 | 1 × 15 |

When DRAM cells are arranged in an array structure, an asymmetric doping profile in a vertical direction of the B region (base region) may block a sneaky path. That is, due to asymmetrical electrical characteristics in a forward direction (E->B->C) and a reverse direction (C->B->E) that is opposite to the forward direction, electrons or holes move in only one direction. This may prevent a phenomenon that electrons and holes move in an adjacent DRAM cell when electrons or holes move in a selected DRAM cell.

In accordance with the embodiment of the present disclosure in which a unit cell does not include a capacitor, charges may be stored in a body region of the unit cell. Thus, a manufacturing process of the inventive unit cell may be simpler than a process of fabricating the conventional DRAM cell including a capacitor. The semiconductor device including the inventive unit cells may be highly integrated and may have low power consumption. Thus, the unit cells according to the embodiment may be employed in a neuromorphic device.

In the embodiment described above, a concentration difference of a dopant may occur when performing the doping process. That is, the doping concentration difference occurs in the body region 10b along the vertical direction. When the doping concentration at an upper portion of the body region 10b of vertical element is higher, a current flowing between a lower portion and the upper portion along the body region 10b may be disabled. That is, when the drain region 10d has a higher doping concentration than the source region 10s, a current from the drain region 10d to the source region 10s may be disabled. Conversely, when the source region 10s has a higher doping concentration than the drain region 10d, a current from the source region 10s to the drain region 10d may be disabled. As a result, the sneaky path may be prevented in the semiconductor device. Thus, the memory malfunction caused by the sneaky path in an adjacent memory cell may be suppressed.

Figure 7A:
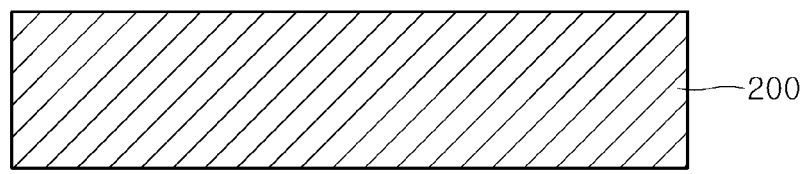
FIGS. 7A and 7B show a method of forming a multi-layered substrate according to an embodiment of the present disclosure.
Figure 7B:
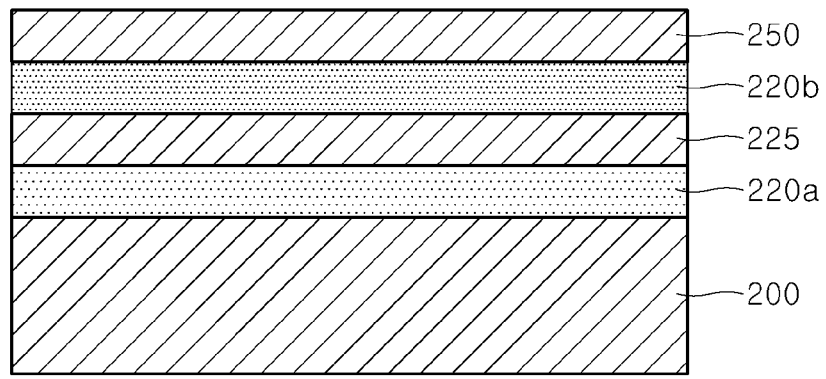

FIGS. 7A and 7B show a method of forming a multi-layered substrate according to an embodiment of the present disclosure.

In FIG. 7A, a substrate 200, e.g., a Si substrate, is provided. In FIG. 7B, an epitaxial growth or epitaxy process is performed on the Si substrate 200. For example, $Si_{1-x}Ge_x$ layers 220a and 220b and Si layers 225 and 250 are alternately stacked on the Si substrate 200 using the epitaxial growth or epitaxy process. In this example shown in FIG. 7B, a topmost layer of the stack structure includes the Si layer 250.

In another example, when the substrate 200 includes $Si_{1-x}Ge_x$ and the Si layers 225 and 250 and the $Si_{1-x}Ge_x$ layers 220a and 220b are alternately stacked on the $Si_{1-x}Ge_x$ substrate 200 using the epitaxial growth or epitaxy process, a topmost layer of the stack structure may include the $Si_{1-x}Ge_x$ layer 220b. That is, the Si layer 225 is stacked on the $Si_{1-x}Ge_x$ substrate 200 first and then the $Si_{1-x}Ge_x$ layer 220a, the Si layer 250, and the $Si_{1-x}Ge_x$ layer 220b are sequentially formed on the Si layer 225.

A DRAM cell with a vertical pillar shape may be configured by applying the processes described with reference to FIG. 3D to FIG. 3I to the substrate to which the epitaxial growth process shown in FIG. 7B has been performed.

Figure 8:
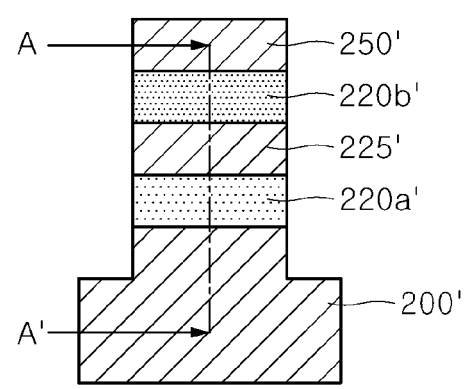
FIG. 8 shows a DRAM cell formed by epitaxial growth according to an embodiment of the present disclosure.

FIG. 8 shows a configuration of a DRAM cell according to an embodiment of the present disclosure. The DRAM cell in FIG. 8 is formed by patterning the substrate 200 on which the Si layers 200 and 250 and the $Si_{1-x}Ge_x$ layers 220a and 220b are alternately stacked. As a result, the DRAM cell includes patterned Si layers 200' and 250' and patterned $Si_{1-x}Ge_x$ layers 220a' and 220b'. In the embodiment shown in FIG. 8, when patterning the Si layers 200 and 250 and the $Si_{1-x}Ge_x$ layers 220a and 220b, an exposed portion of the substrate 200 is recessed by a certain depth from a top surface of the substrate 200, such that a partially recessed substrate 200' is formed.

In this embodiment, an SBE (Superlattice Bandgap engineering) technique may be implemented by repeatedly stacking channel material layers in a vertical direction. Thus, the configuration of FIG. 8 may maximize a storage capacity of the DRAM cell by using a bandgap offset.

Reference will be made to details of the $Si_{1-x}Ge_x$ layers 220a and 220b in a body region. In an embodiment, adjusting x (0≤x≤1) in the material of the body region may change memory characteristics of the DRAM cell. By changing x, a depth of an energy well may vary. Thus, when an n-type or p-type device is fabricated, an accumulated number of electrons or holes may vary. As a result, a charge trapping ability of the body region during a memory operation may be changed to improve a data storage capacity.

In another embodiment, a thickness of each of the $Si_{1-x}Ge_x$ layers 220a' and 220b in the body region may be adjusted to improve the charge trapping ability of the body region during the memory operation. The adjusting of the thicknesses may allow the charge trapping capability to be changed, which may improve the data storage capacity in the memory operation. In an embodiment, the $Si_{1-x}Ge_x$ layers 220a and 220b may be adjusted as small as 1 nanometer and as large as a few nanometers, respectively.

In addition, various materials may be used in addition to the above-mentioned $Si_{1-x}Ge_x$ compound. For example, a depth of the energy well may be controlled using a III-V compound such as GaN/InGaN, $InAs/In_{1-x}Ga_xAs$, $Al_xGa_{1-x}/GaAs$, or the like. Therefore, a semiconductor device having various materials and structures may be manufactured or implemented using any of the above III-V compounds.

When applying the embodiments of the present disclosure, a charge storage ability of a body region may vary based on a vertical length and a width of the body region in a semiconductor device. As a result, memory characteristics of the semiconductor device may be changed according to the vertical length and the width of the body region.

Referring back to FIGS. 7A and 7B and FIG. 8, in a structure in which multiple DRAM cells are vertically oriented on the substrate 200', each DRAM cell may include a drain region of a first material vertically disposed on the substrate 200', the body region 220a', 225', and 220b' vertically disposed on the drain region, and a source region 250' of the first material vertically disposed on the body region 220b'. In this connection, the body region includes a stack structure of the first material layer 225' and the second material layers 220a' and 220b'.

The first material layer defines each of the drain region 200' and the source region 250' and defines the first material layer 225' within the body region. The second material layer defines each of the layer 220a' and 220b' between the first material layers.

FIG. 8 illustrates a stack structure of three layers such as the second material layer 220a'/the first material layer 225'/the second material layer 220b'. However, embodiments of the present disclosure are not limited thereto. The number of layers included in one stack structure may vary. For example, when a stack structure of five layers is formed through epitaxial growth, the five layers may include the second material layer/the first material layer/the second material layer/the first material layer/the second material layer. The number of layers included in a single stack structure may increase on a 2N+1 basis (N is a natural number).

In an embodiment, thicknesses of the layers in the single stack structure may be different. This may improve a low-power consumption memory effect.

In an embodiment, the first material is Si and the second material is $Si_{1-x}Ge_x$. In another embodiment, the first material is $Si_{1-x}Ge_x$ and the second material is Si.

Alternatively, a material pair of the first material and the second material or a material pair of the second material and the first material may be any of GaN/InGaN, InAs/In$_{1-x}$Ga$_x$As, Al$_x$Ga$_{1-x}$/GaAs, etc.

The n+ doping scheme described above with reference to FIGS. 3A to 3I forms the three doped layers in the substrate 100. The stacking scheme described above with reference to FIGS. 7A and 7B and FIG. 8 forms several stacked layers on the substrate 200. The stacking scheme may further enhance a memory effect of a DRAM cell compared to the doping scheme. Increasing the number of stacked layers using the stacking scheme rather than using the doping scheme can more accurately distinguish regions in the DRAM cell from each other. The stacking scheme may reliably control the number of layers in each region of the DRAM cell or a thickness of each region of the DRAM cell. Therefore, when the stacking scheme is applied, the thickness of each region or the number of layers in each region may be adapted to target memory characteristics of the DRAM cell.

The DRAM cell shown in FIG. 8 may be connected to a word line and a bit line, as descried above referring to FIG. 4. In an embodiment, the bit line electrically connects drain regions 200' of two or more DRAM cells arranged in a first direction, and the word line electrically connects source regions 250' of two or more DRAM cells arranged in a second direction that is different from the first direction.

In an embodiment, the first direction and the second direction may be orthogonal to each other. In other embodiments, the first direction and the second direction may cross each other to have any of various angles, such as 60 degrees, 30 degrees, etc., based on the orientation of the DRAM cell. In other words, a vector corresponding to the first direction and a vector corresponding to the second direction may define different angles.

Figure 9:
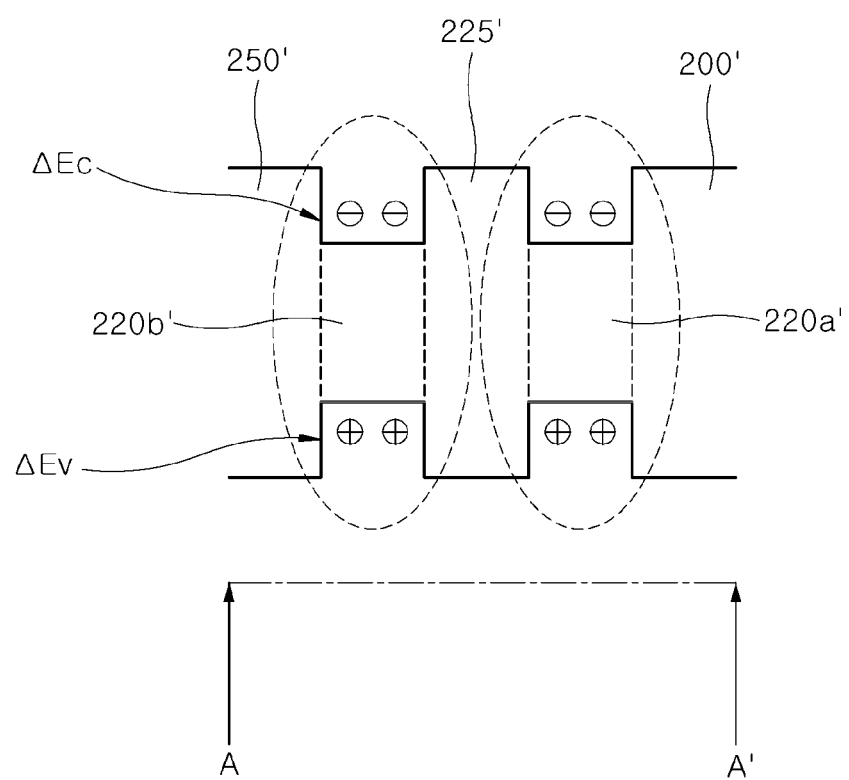
FIG. 9 shows an energy band diagram of an SBE structure shown in FIG. 8 according to an embodiment of the present disclosure.

FIG. 9 is an enlarged view of the DRAM cell of FIG. 8, which is taken along line A-A' in FIG. 8. FIG. 9 shows an energy band diagram of an SBE structure shown in FIG. 8 according to an embodiment of the present disclosure.

Referring to FIG. 8, the stack structure of the $Si_{1-x}Ge_x$ layers 220a' and 220b' and the Si layer 225' is disposed between the Si layer 250' constituting the source region and the Si layer 200' constituting the drain region. This structure may be constructed by applying the SBE technique. The structure has an open body configuration without a gate.

Within each of the $Si_{1-x}Ge_x$ layers 220a' and 220b', a bandgap offset is generated between a valence band energy ΔEv and a conduction band energy ΔEc, and the bandgap offset occurs at both ends of each of the $Si_{1-x}Ge_x$ layers 220a' and 220b'. Using the bandgap offset may maximize the storage of holes or electrons. As a result, a sensing margin and retention time characteristics of the DRAM cell may be improved. Thus, a charge holding characteristic of the DRAM cell may be improved. Further, this may implement a capacitorless structure in the DRAM cell.

In this connection, controlling the numbers of Si layers and $Si_{1-x}Ge_x$ layers constituting an intermediate base region, that is, the body regions 220a', 225', and 220b' and the thickness of each of the layers may result in adjusting a band gap, which may control the memory characteristics of the DRAM cell. That is, two or more $Si_{1-x}Ge_x$ layers may be arranged to improve device performance.

When the $Si_{1-x}Ge_x$ layer has a smaller band gap than the Si layer, a current flowing through the DRAM cell may be increased due to impact ionization resulting from hot carriers with high energy.

FIGS. 7A to 9 may be summarized as follows:

A lattice-mismatched layer with a thickness of tens of Å is grown on a crystal wafer and, then, an epitaxial layer is grown on the lattice-mismatched layer. When the lattice-mismatched layer is very thin and a lattice mismatch coefficient f is small, the epitaxial layer grows based on a lattice constant of a wafer crystal that is a seed. The epitaxially grown layer may be called a pseudomorphic layer. A stack structure in which the lattice-mismatched layer and the pseudomorphic layer are alternately stacked in a vertical direction one or more times may define a strained layer superlattice (SLS).

Each strained layer may have tension stress and compression stress, which are balanced to control an overall stress. Control of the overall stress using the superlattice strained layer may reduce crystal defects and produce high-quality uniform surfaces. Generally, a lattice constant of the superlattice strained layer may be calculated as an average value of lattice constants of materials of the lattice-mismatched layer and the pseudomorphic layer. Modulation doping allows free charge carriers to be spatially separated from donors. This may produce a very high mobility of a two-dimensional electric current in semiconductors.

The drain region of the DRAM cell (e.g., 10d in FIG. 2 or 200' in FIG. 8) is connected to the bit line (e.g., 60 in FIG. 4) extending in the first direction. At the same time, the source region of the DRAM cell (e.g., 10s in FIG. 2 or 250' in FIG. 8) is connected to the word line (e.g., 70 in FIG. 4) extending in the second direction, which is different from the first direction. Between the drain region and the source region, the body region (e.g., 10b in FIG. 2 or 220a', 225', and 220b' in FIG. 8) is disposed.

The body region stores holes or electrons therein based on a magnitude of a voltage applied to the bit line 60 and the word line 70, thereby writing/reading data 0 or 1. In this way, an operation of the DRAM cell may be controlled. This control is performed to increase the memory effect based on how the body region is configured.

According to the embodiment of FIG. 8, each of the drain region 200' and the source region 250' is made of the first material, and the body region includes the vertical stack structure of the second material layers 220a' and 220b' and the first material layer 225'.

Figure 10:
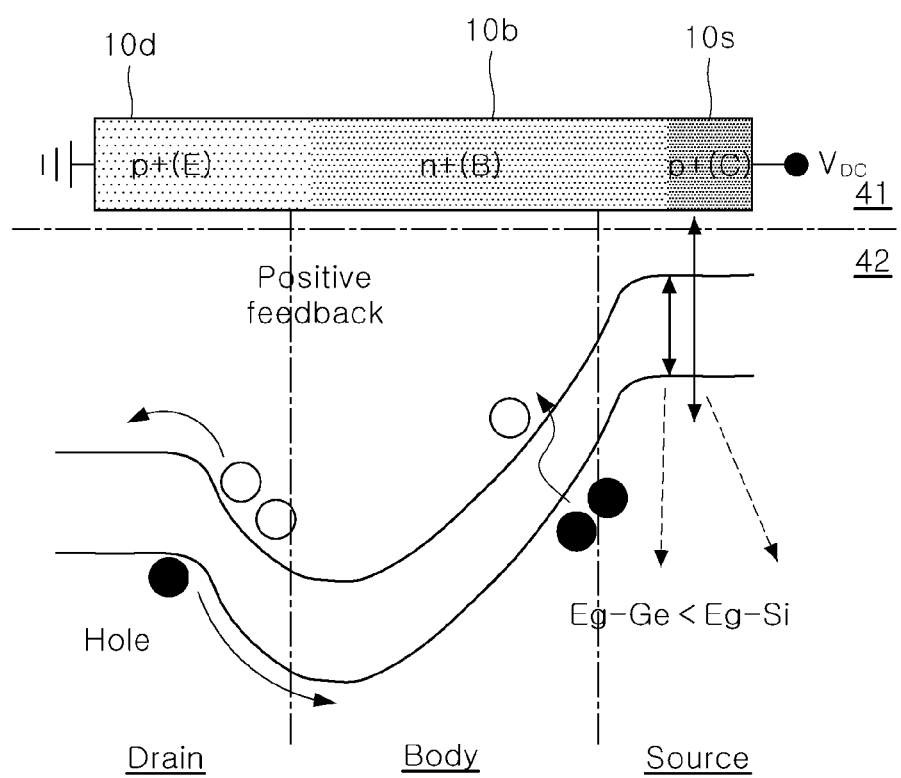
FIG. 10 shows a memory operation of a semiconductor device according to an embodiment of the present disclosure.

FIG. 10 shows a memory operation of a semiconductor device according to an embodiment of the present disclosure. The following description will be directed to the semiconductor device shown in FIG. 2 to FIG. 6.

Reference numeral 41 denotes a configuration in which a voltage VDC is applied to a source region 10s (C region) and a ground GND is connected to a drain region 10d (E region). A graph 42 of FIG. 10 shows transfer of holes and electrons along the drain region 10d, the body region 10b (B region), and the source region 10s. When the voltage $V_{DC}$ applied to the source region 10s is increased, the impact ionization causes latch-up in the body region 10b. Thus, a current flowing through the semiconductor device rapidly increases due to the latch-up, resulting in a '1' state. On the contrary, when the voltage $V_{DC}$ is decreased, latch-down occurs in the body region 10b, such that the '1' state of the body region 10b turns into a '0' state. A BJT structure with an open base and two terminals (a source and a drain), acts as a memory cell using the impact ionization. This BJT structure may implement a low operating voltage and a high driving current based on germanium (Ge), thereby to improve a sensing margin.

Since, in the graph 42 of FIG. 10, a band gap of Ge is smaller than a bandgap of Si (that is, Eg-Ge<Eg-Si), electrons and holes may move at a low voltage. In addition, the high sensing margin may be secured.

Figure 11:
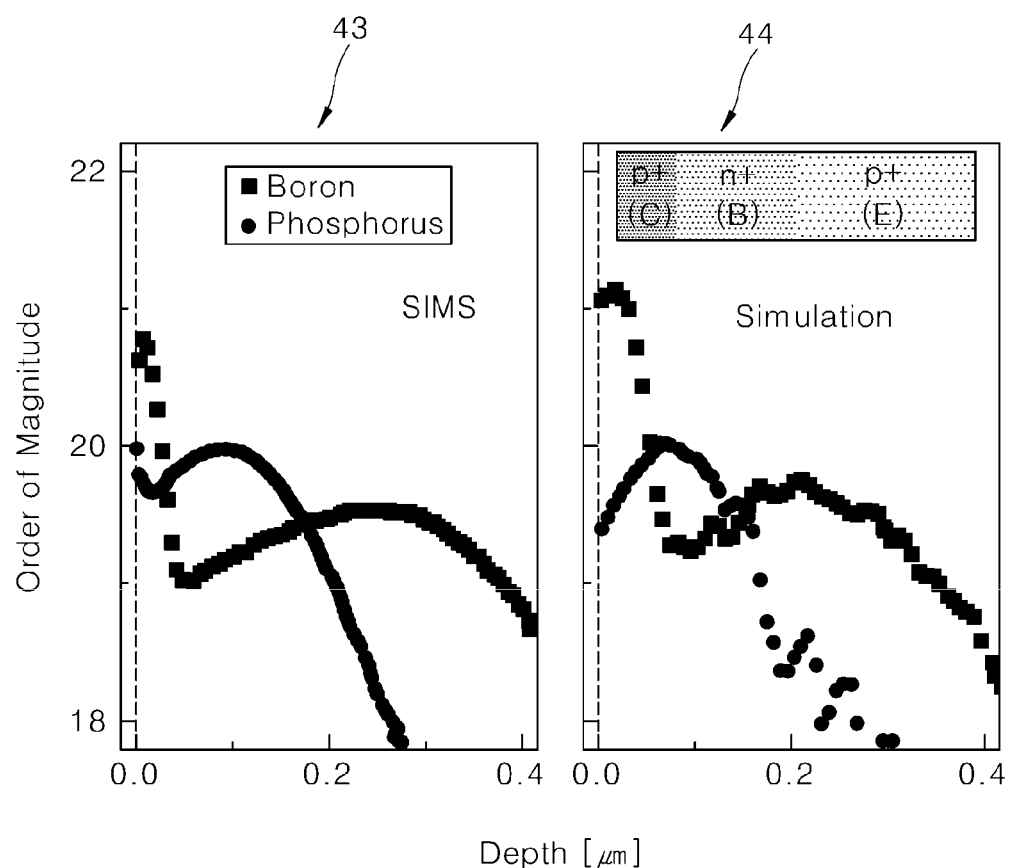
FIG. 11 provides graphs showing positioning of doped materials when a selector-free structure is configured using doping according to an embodiment of the present disclosure.

FIG. 11 provides plots showing positioning of doped materials when a selector-free structure is configured by doping according to an embodiment of the present disclosure. A plot 43 shows an expected distribution of doped materials according to a depth, and a plot 44 shows an actual distribution of doped materials according to a depth. The plot 44 distinguishes a source region (collector C), a body region (base B), and a drain region (emitter E) as compared with the left plot 43.

It may be confirmed from the left and right plots 43 and 44 of FIG. 11 that an asymmetric doping profile is configured along an x-axis direction with respect to the orientation of FIG. 11. The x-axis direction in FIG. 11 corresponds to a vertical direction of a unit cell that is perpendicular to a top surface of a substrate (not shown) on which the three regions E, B, and C are stacked along the vertical direction. This configuration may block a sneaky path in an array structure configured with two terminals C and E. With reference to FIG. 4, it has been confirmed that during a current-forwarding process in a specific cell, a reverse current in an adjacent cell to the specific cell may be disabled. In addition, when using the two terminals C and E, a '1' state is created in the specific cell by applying an increasing voltage to the source terminal C. Conversely, the applied voltage is decreased to bring about the '0' state in the specific cell. Thus, a separate selector is not required in a cell.

Figure 12:
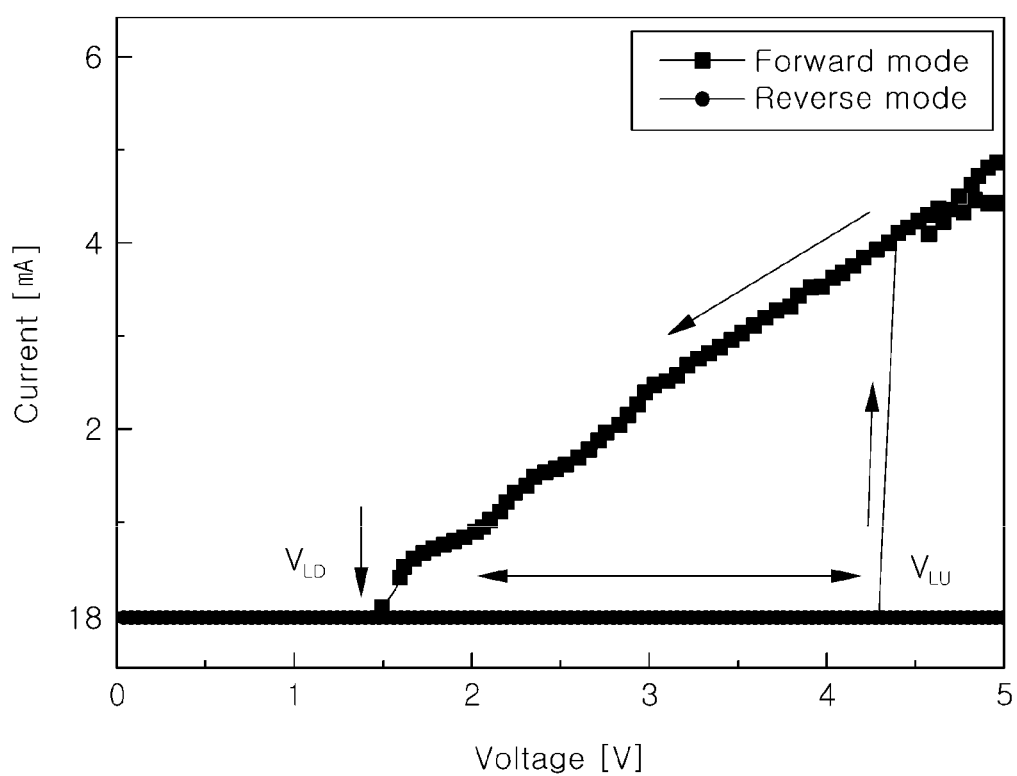
FIG. 12 is a graph showing a relationship between a voltage and a current in forward and reverse modes according to an embodiment of the present disclosure.

FIG. 12 shows a relationship between a voltage and a current in forward and reverse modes according to an embodiment of the present disclosure. Reference will be made to a DRAM cell configured using the doping scheme as previously described with reference to FIGS. 3A to 6.

In the forward mode, it may be seen that the current decreases as the voltage goes from a latch-up voltage $V_{LU}$ to a latch-down voltage $V_{LD}$. At the latch-up voltage $V_{LU}$, the current rapidly increases and brings about a '1' state in the DRAM cell. After that, when the voltage continuously decreases and reaches the latch-down voltage $V_{LD}$, the decreased current brings about a '0' state in the DRAM cell. On the other hand, in the reverse mode, there is no change in the current even though the voltage changes between the latch-up voltage $V_{LU}$ and the latch-down voltage $V_{LD}$. As a result, the DRAM cell operates stably. Doping dopants into a p-type Ge wafer as in the embodiment of FIGS. 3A to 6 such that C/B/E regions may be distinguished from each other may achieve a low operating voltage and a high driving current.

In embodiments of the present disclosure, a vertical cell having a pillar shape is formed on a substrate that is ion-doped or a substrate that is configured by the epitaxial growth. The vertical cell defines a DRAM cell. In this process, a diameter of the pillar shape may be reduced to about 30 nm or smaller by a process such as PR trimming. By reducing the diameter of the pillar shape, it is possible to increase the degree of integration of a semiconductor device.

Figure 13:
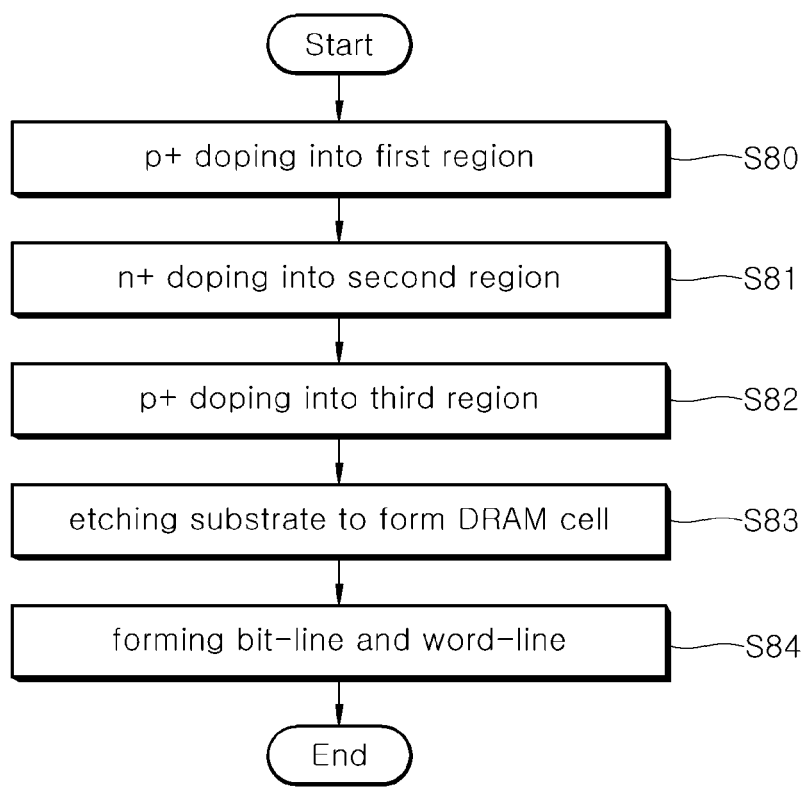
FIG. 13 shows a method for fabricating a semiconductor device according to an embodiment of the present disclosure.

FIG. 13 shows a method of fabricating a DRAM cell with a doping process according to an embodiment of the present disclosure. The method of FIG. 13 will be described with reference FIGS. 3A to 3I.

As described above, a substrate may be divided into three regions: a first region, a second region, and a third region. A first impurity doping process is performed into the first region (S80). In an embodiment, the first impurity has a p+ conductivity type. Subsequently, a second impurity doping process is performed in the second region disposed on the first region (S81). In an embodiment, the second impurity has an n+ conductivity type. Similarly, the first impurity process, i.e., the p+ doping process, is performed in the third region disposed on the second region (S82). In an embodiment, when a p-type substrate is used, only the process S81, i.e., the second impurity (n+) doping process, may be performed, and the processes S80 and S82, i.e., the first impurity (p+) doping process, may be omitted. As a result, the first p+ doping region 10D, the second n+ doping region 10B, and the third p+ doping region 10S are sequentially formed in the substrate 100, as shown in FIG. 3B.

Subsequently, the substrate 100 including the first to third doping regions 10D, 10B, sand 10S is etched to form an array of DRAM cells (S83), each DRAM cell employing the drain region 10d, the body region 10b, and the source region 10s, as shown in FIG. 3D. Then, the bit line 60 and the word line 70 are formed to be electrically connected to the drain region 10d and the source region 10s, respectively (S84), as shown in FIG. 3I.

More specifically, the bit line 60 extends to electrically connect drain regions of two or more DRAM cells arranged in the first direction. The insulating material 59 may be deposited between the DRAM cells to insulate the DRAM cells from each other. The word line 70 extends to electrically connect source regions of two or more DRAM cells arranged in the second direction that is different from the first direction.

Figure 14:
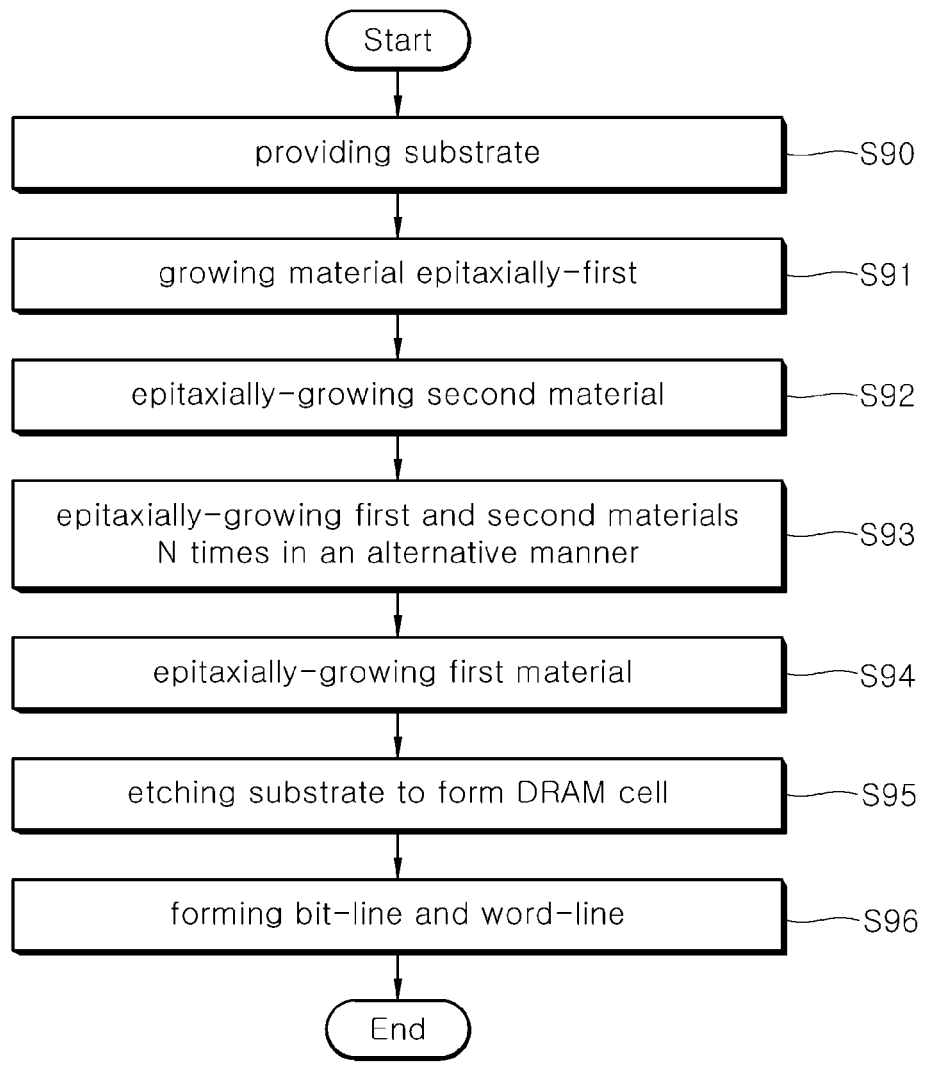
FIG. 14 shows a method for fabricating a semiconductor device according to another embodiment of the present disclosure.

FIG. 14 illustrates a method of fabricating a semiconductor device with an epitaxial growth process according to another embodiment of the present disclosure.

A substrate is prepared (S90). Alternatively, in another embodiment, the first material epitaxial growth process can be performed on the substrate with a first thickness (S91). Preparing a substrate of a first material is one embodiment, and preparing the epitaxial growth process using the first material is another embodiment. Subsequently, the second material epitaxial growth is performed by a first height (S92). In an embodiment, a layer formed by the first material growth process constitutes a drain region of a DRAM cell. In another embodiment, when a substrate made of the first material is prepared prior to the epitaxial growth, the first material epitaxial growth process S91 may be omitted.

Subsequently, a second material epitaxial growth process is performed (S92). After that, an epitaxial growth process in which the first material and the second material alternately grow N times on the substrate may be performed (S93), N being a natural number. A multi-layer formed by the second material epitaxial growth process and the alternative epitaxial growth process has a second thickness and constitutes a body region of the DRAM cell. In an embodiment, this alternating epitaxial growth process may be performed to reliably maintain electrons and holes in the body portion of the DRAM cell.

Then, an epitaxial growth process in which the first material grows on the body region may be performed with a third thickness (S94). A layer formed by this first material epitaxial growth process constitutes a source region of the DRAM cell.

Subsequently, the substrate including a stack structure in which the first material and the second material are alternately stacked by the epitaxial growth processes may be etched (S95). As a result, the semiconductor device employing the drain region with the first thickness, the body region with the second thickness, and the source region with the third thickness and employing only some of the lowest first material layer as the drain region may be formed. Then, a bit line electrically connecting drain regions of two or more DRAM cells arranged in the first direction and a word line electrically connecting source regions of two or more DRAM cells arranged in the second direction different from the first direction may be formed (S96).

As seen above in FIG. 13, and more particularly, as shown in FIGS. 3E, 3F, and 3G forming the bit line 60 and the word line 70 may include following processes: forming the bit line 60 extending in the first direction to electrically connect drain regions of two or more DRAM cells arranged in the first direction; depositing the insulation material 59 between DRAM cells formed over the substrate 100 to insulate the DRAM cells from each other; and forming the word line 70 extending in the second direction to electrically connecting source regions of two or more DRAM cells arranged in the second direction.

In the above method shown in FIG. 14, the first material and the second material may be determined differently based on the epitaxial growth processes. In an embodiment, the first material is Si and the second material is $Si_{1-x}Ge_x$. In another embodiment, conversely, the first material is $Si_{1-x}Ge_x$ and the second material is a Si. Alternatively, a material pair of the first material and the second material or a material pair of the second material and the first material may be any of GaN/InGaN, $InAs/In_{1-x}Ga_xAs$, $Al_xGa_{1-x}/GaAs$, etc.

When the embodiments of the present disclosure are applied, a gateless (thus, free of a gate insulating film) and capacitorless structure may be implemented in a unit call of a semiconductor device such as a DRAM, which may drastically reduce the number of fabricating processes compared to the conventional structure including a gate and a capacitor. In particular, since there is no gate insulating film, a device reliability-related problem due to deterioration of the gate insulating film may be essentially eliminated.

In addition, an operation of the semiconductor device may be simplified by storing charges in a body region (or a base region) rather than in a capacitor. Further, a size of a unit cell may be reduced and thus the degree of integration of the semiconductor device may be increased. In addition, the size of the body region (or the base region) may be adjusted by adjusting a PR (Projected Range) of an ion implantation process that is performed when forming each of C, B, and E regions, or by adjusting a thickness of each of the C, B, and E regions. This may lead to an enhanced charge storage ability.

As described above with reference to FIGS. 4 and 6, the asymmetric doping profile of the body region along the vertical direction may block a sneaky path in a cell adjacent to a selected cell in a cell array.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:

1. A semiconductor device comprising:
    a substrate:
    a drain region disposed on the substrate;
    a body region disposed on the drain region;
    a source region disposed on the body region;
    a bit line connected to the drain region and extending in a first direction; and
    a word line connected to the source region and extending in a second direction that is different from the first direction,
    wherein the drain region, the body region, and the source region together define a pillar extending in a third direction that is perpendicular to the first and second directions, and
    wherein the body region includes a stack structure in which a first material and a second material are alternately stacked one or more times.

2. The semiconductor device of claim 1, wherein the bit line electrically connects two or more drain regions arranged in the first direction, and the word line electrically connects two or more source regions arranged in the second direction.

3. The semiconductor device of claim 1, wherein each of the drain region and the source region is a first impurity doped region, and the body region is a second impurity doped region.

4. The semiconductor device of claim 3, wherein as being closer to the center of the body region from the drain or source region, a doping concentration of the second impurity increases.

5. The semiconductor device of claim 1, wherein each of the drain region and the source region is a p+doped region, and the body region is an n+doped region.

6. The semiconductor device of claim 1, wherein each of the drain region and the source region is an n+doped region, and the body region is a p+doped region.

7. The semiconductor device of claim 1, wherein the substrate includes a silicon (Si) substrate, a silicon germanium (SiGe) substrate, a germanium (Ge) substrate, or the like.

8. The semiconductor device of claim 1,
    wherein each of the drain region and the source region includes the first material
    and the second material is different from the first material.

9. The semiconductor device of claim 8, wherein the first material is one of silicon (Si) and $Si_{1-x}Ge_x$; and the second material is the other one of Si and $Si_{1-x}Ge_x$, x being in a range of 0 to 1.

10. The semiconductor device of claim 8, wherein a material pair of the first material and the second material or a material pair of the second material and the first material includes one selected from a group consisting of GaN/InGaN, $InAs/In_{1-x}Ga_xAs$, and $Al_xGa_{1-x}/GaAs$, x being in a range of 0 to 1.

11. The semiconductor device of claim 8, wherein the body region includes a first layer, a second layer, and a third layer, the first and third layer including the second material, and the second layer including the first material.

12. A method of manufacturing a semiconductor device, the method comprising:
    providing a substrate having first, second, third regions divided in a third direction;
    doping a first impurity into the first region;
    doping a second impurity into the second region disposed on the first region;
    doping the first impurity into the third region disposed on the second region;
    patterning the substrate into which the first and second impurities are doped to form a plurality of unit cells, wherein each unit cell has the first region as a drain region, the second region as a body region, and the third region as a source region;

forming a bit line that extends in a first direction and is connected to the drain region; and forming a word line that extends in a second direction and is connected to the source region, the second direction being different from the first direction, wherein the drain region, the body region, and the source region together define a pillar extending in the third direction that is perpendicular to the first and second directions, and wherein as being closer to the center of the body region from the drain or source region, a doping concentration of the second impurity increases.

13. The method of claim 12, wherein the first impurity has a p+conductivity type, and the second impurity has an n+conductivity type.

14. The method of claim 12, wherein the first impurity has an n+conductivity type, and the second impurity has a p+conductivity type.

15. The method of claim 12, wherein the bit line is formed to electrically connect drain regions of two or more unit cells arranged in the first direction, wherein the method further includes depositing an insulating material to fill spaces between the plurality of unit cells, and wherein the word line is formed to electrically connect source regions of two or more unit cell arranged in the second direction.

16. A method of manufacturing a semiconductor device, the method comprising:

providing a substrate;

forming a first region on the substrate, the first region including a first material;

forming a second region on the drain region, the second region including the first material and a second material that are alternately stacked one or more times;

forming a third region on the body region, the third region including the first material;

patterning the first to third regions and the substrate to form a plurality of unit cells, wherein each unit cell has the first region as a drain region, the second region as a body region, and the third region as a source region;

forming a bit line that extends in a first direction and is connected to the drain region; and forming a word line that extends in a second direction and is connected to the source region, the second direction being different from the first direction, wherein the drain region, the body region, and the source region are stacked in a third direction, and define a pillar extending in the third direction that is perpendicular to the first and second directions.

17. The method of claim 16, wherein the first material is one of silicon (Si) and $Si_{1-x}Ge_x$; and the second material is the other one of Si and $Si_{1-x}Ge_x$, x being in a range of 0 to 1.

18. The method of claim 16, wherein a material pair of the first material and the second material or a material pair of the second material and the first material includes one selected from a group consisting of GaN/InGaN, $InAs/In_{1-x}Ga_xAs$, and $Al_xGa_{1-x}/GaAs$, x being in a range of 0 to 1.

19. The method of claim 16, wherein the body region includes a first layer, a second layer, and a third layer, the first and third layer including the second material, and the second layer including the first material.

* * * * *